(12) United States Patent
Rulkens et al.

(10) Patent No.: US 7,097,878 B1
(45) Date of Patent: Aug. 29, 2006

(54) MIXED ALKOXY PRECURSORS AND METHODS OF THEIR USE FOR RAPID VAPOR DEPOSITION OF SIO₂ FILMS

(75) Inventors: Ron Rulkens, Milpitas, CA (US); Dennis M. Hausmann, Los Gatos, CA (US); Raihan M. Tarafdar, San Jose, CA (US); George D. Papasouliotis, Cupertino, CA (US); Bunsen Nie, Fremont, CA (US); Adrianne K. Tipton, Fremont, CA (US); Jeff Tobin, Mountain View, CA (US)

(73) Assignee: Novellus Systems, Inc., San Jose, CA (US)

( * ) Notice: Subject to any disclaimer, the term of this patent is extended or adjusted under 35 U.S.C. 154(b) by 12 days.

(21) Appl. No.: 10/874,814

(22) Filed: Jun. 22, 2004

(51) Int. Cl.
*C23C 16/40* (2006.01)
*C23C 16/56* (2006.01)

(52) U.S. Cl. .......................... 427/255.11; 427/255.15; 427/255.18; 427/255.19; 427/255.7; 428/446; 428/450

(58) Field of Classification Search ................. None
See application file for complete search history.

(56) References Cited

U.S. PATENT DOCUMENTS

| | | | |
|---|---|---|---|
| 5,314,724 A | 5/1994 | Tsukune et al. |
| 5,525,550 A | 6/1996 | Kato |
| 5,527,561 A | 6/1996 | Dobson |
| 5,705,028 A | 1/1998 | Matsumoto |
| 5,985,770 A | 11/1999 | Sandhu et al. |
| 6,030,881 A | 2/2000 | Papasouliotis et al. |
| 6,102,993 A | 8/2000 | Bhandari et al. |
| 6,133,160 A | 10/2000 | Komiyama et al. |
| 6,184,143 B1 | 2/2001 | Ohashi et al. |
| 6,300,219 B1 | 10/2001 | Doan et al. |
| 6,316,063 B1 * | 11/2001 | Andideh et al. ............ 427/577 |
| 6,335,261 B1 | 1/2002 | Natzle et al. |
| 6,352,943 B1 | 3/2002 | Maeda et al. |
| 6,352,953 B1 | 3/2002 | Seki et al. |
| 6,372,669 B1 | 4/2002 | Sandhu et al. |
| 6,503,330 B1 | 1/2003 | Sneh et al. |
| 6,511,539 B1 | 1/2003 | Raaijmakers |
| 6,531,377 B1 | 3/2003 | Knorr et al. |
| 6,534,395 B1 | 3/2003 | Werkhoven et al. |
| 6,534,802 B1 | 3/2003 | Schuegraf |
| 6,540,838 B1 | 4/2003 | Sneh et al. |
| 6,551,339 B1 | 4/2003 | Gavronsky |
| 6,551,399 B1 | 4/2003 | Sneh et al. |
| 6,802,944 B1 | 10/2004 | Ahmad et al. |
| 6,861,334 B1 | 3/2005 | Raaijmakers et al. |
| 6,867,152 B1 | 3/2005 | Hausmann et al. |
| 6,908,862 B1 | 6/2005 | Li et al. |
| 2001/0049205 A1 | 12/2001 | Sandhu et al. |
| 2003/0015764 A1 | 1/2003 | Raaijmakers et al. |
| 2003/0092241 A1 | 5/2003 | Doan et al. |
| 2003/0129828 A1 | 7/2003 | Cohen et al. |
| 2003/0157781 A1 | 8/2003 | Macneil et al. |
| 2004/0004247 A1 | 1/2004 | Forbes et al. |
| 2004/0043149 A1 | 3/2004 | Gordon et al. |
| 2004/0044127 A1 | 3/2004 | Okubo et al. |
| 2004/0079728 A1 | 4/2004 | Mungekar et al. |
| 2004/0102031 A1 | 5/2004 | Kloster et al. |
| 2004/0206267 A1 | 10/2004 | Sambasivan et al. |
| 2005/0054213 A1 | 3/2005 | Derderian et al. |
| 2005/0112282 A1 | 5/2005 | Gordon et al. |
| 2005/0239264 A1 | 10/2005 | Jin et al. |

FOREIGN PATENT DOCUMENTS

| | | | |
|---|---|---|---|
| JP | 5-308071 A | * | 11/1993 |
| JP | 2004-256479 | * | 9/2004 |
| WO | WO02/27063 | | 4/2002 |
| WO | WO03/083167 A1 | | 10/2003 |

OTHER PUBLICATIONS

U.S. Office Action mailed Dec. 5, 2005, from U.S. Appl. No. 10/746,274.
U.S. Office Action mailed Dec. 30, 2005, from U.S. Appl. No. 11/026,284.
U.S. Office Action mailed Dec. 7, 2005, from U.S. Appl. No. 10/874,808.
U.S. Office Action mailed Dec. 22, 2005, from U.S. Appl. No. 11/026,563.
Papasouliotis et al., "Metal-Free Catalysts for Pulsed Deposition Layer Process for Conformal Silica Laminates", Novellus Systems, Inc., U.S. Appl. No. 11/318,268, filed Dec. 23, 2005, pp. 1-30.
Cho et al., "Localized Energy Pulse Rapid Thermal Anneal Dielectric Film Densification Method", Novellus Systems, Inc., U.S. Appl. No. 11/327,668, filed Jan. 5, 2006, pp. 1-28.

(Continued)

*Primary Examiner*—Marc S. Zimmer
(74) *Attorney, Agent, or Firm*—Beyer Weaver & Thomas LLP.

(57) ABSTRACT

A method employing rapid vapor deposition (RVD) deposits a dielectric material on small features of a substrate surface. The resulting dielectric film is thicker, faster growing, shows better gap fill performance and has improved film properties compared to films resulting from silicon precursors with identical alkoxy substituents on silicon. The method includes the following two principal operations: exposing a substrate surface to a metal-containing precursor gas to form a substantially saturated layer of metal-containing precursor on the substrate surface; and exposing the substrate surface to a mixed alkoxy-substituted silicon-containing precursor gas to form the dielectric film.

19 Claims, 6 Drawing Sheets

OTHER PUBLICATIONS

Papasouliotis et al., "Reactive Seam Healing Methods for Improving Film Integrity In Structures of Confined Geometry", Novellus Systems, Inc., U.S. Appl. No. 11/334,762, filed Jan. 17, 2006, pp. 1-24.

U.S. Office Action mailed May 31, 2005, from U.S. Appl. No. 10/746,274.

Hausmann et al., "Plasma Treatments to Improve the Properties of Silica Thin Films Produced by a Rapid Vapor Deposition (RVD)", Novellus Systems, Inc., filed Dec. 23, 2000, U.S. Appl. No. 10/746,274, pp. 1-29.

Greer et al., "Method and Apparatus to Reduce the Frequency of Chamber Cleans in Rapid Vapor Deposition (RVD) of Silicon Oxide", Novellus Systems, Inc., filed Jul. 12, 2004, U.S. Appl. No. 10/890,376, pp. 1-25.

Hausmann et al., "Silica Thin Films Produced by Rapid Surface Catalyzed Vapor Deposition (RVD) Using a Nucleation Layer", Novellus Systems, Inc., filed Jun. 22, 2004, U.S. Appl. No. 10/875,158, pp. 1-25.

U.S. Office Action mailed Jun. 23, 2005, from U.S. Appl. No. 10/874,808.

Hausmann et al., "Aluminum Phosphate Incorporation in Silica Thin Films Produced by Rapid Surface Catalyzed Vapor Deposition (RVD)", Novellus Systems, Inc., filed Jun. 22, 2004, U.S. Appl. No. 10/874,808, pp. 1-21.

Papsouliotis et al., "Method for Controlling Properties of Conformal Silica Nanolaminates Formed by Rapid Vapor Deposition", Novellus Systems, Inc., filed Jun. 22, 2004, U.S. Appl. No. 10/874,696, pp. 1-30.

Gaillard et al., "Silicon dioxide chemical vapor deposition using silane and hydrogen peroxide", Rapid Communications, J. Vac. Sci. Technol. B 14(4), Jul./Aug. 1996, pp. 2767-2769.

Beekmann, et al., "Properties of posttreated low κ flowfill™ films and their stability after etch, resist and polymer strip processes", Microelectronic Engineering 55(2001), pp. 73-79.

Robl et al., "Integration of Flowfill® and Forcefill® for cost effective via applications" Sep. 1999, pp. 77-83.

Penka et al., "Integration Aspects of Flowfill and Spin-on-Glass Process for Sub-0.35μm Interconnects", pp. 1-3.

Hockele et al., "Flowfill-Process as a New Concept for Inter-Metal-Dielectrics", Siemens AG, Semiconductor Group, 1998, pp. 235-238.

Roland et al., "Theoretical Modeling of $SiO_2$ Photochemical Vapor Deposition and Comparison to Experimental Results for Three Oxidant Chemistries: $SiH_4+O_2$, $H_2O/O_2$, and $H_2O_2$", Chem Mater 2001, 13, 2501-2510.

Roland et al., "Low Temperature Photochemical Vapor Deposition of SiO2 Using 172 nm Xe2* Excimer Lamp Radiation with Three Oxidant Chemistries: $O_2$, $H_2O/O_2$, and $H_2O_2$", Chem Mater 2001, 13, 2493-2500.

Moore et al., "Reaction of hydrogen peroxide with organosilanes under chemical vapour deposition conditions", J. Chem. Soc., Dalton Trans., 2000, 2673-2677.

Taylor et al., "Studies on the reaction between silane and hydrogen peroxide vapour; surface formation of planarized silica layers", J. Chem. Soc., Dalton Trans., 1997, pp. 1049-1053.

Xia et al., "High Aspect Ratio Trench Filling Using Two-Step Subatmospheric Chemical Vapor Deposited Borophosphosilicated Glass for <0.18 μm Device Application", Journal of The Electrochemical Society, 146 (5) 1884-1888 (1999).

Xia et al., "High Temperature Subatmospheric Chemical Vapor Deposited Undoped Silicated Glass—A Solution for Next Generation Shallow Trench Isolation", Journal of The Electrochemical Society, 146 (3) 1181-1185 (1999).

Arno et al., "Fourier Transform Infrared Characterization of Downstream Gas-Phase Species Generated by Tetraethylorthosilicate/Ozone Atmospheric Pressure Reactions", Journal of The Electrochemical Society, 146 (1) 276-280 (1999).

Romet et al., "Modeling of Silicon Dioxide Chemical Vapor Deposition from Tetraethoxysilane and Ozone", Journal of The Electrochemical Society, 148 (2) G82-G90 (2001).

Ikeda et al., "The Effects of Alkoxy Functional Groups on Atmospheric-Pressure Chemical Vapor Deposition Using Alkoxysilane and Ozone", J. Electrochem. Soc., vol. 142, No. 5, May 1995, pp. 1659-1662.

"Customer A low κ Gapfill Trikon Flowfill vs FHDP", Novellus Systems, Inc., pp. 1-12.

Ritala et al., "Atomic Layer Deposition", Handbook of Thin Films Materials, vol. 1, 2002, pp. 103-159.

Rulkens et al., "Methods for the Use of Alkoxysilanol Precursors for Vapor Deposition of $SiO_2$ Films", Novellus Systems, Inc., filed Dec. 23, 2004, U.S. Appl. No. 11/021,558, pp. 1-24.

Papasouliotis et al., "Dynamic Rapid Vapor Deposition Process for Conformal Silica Laminates", Novellus Systems, Inc., filed Dec. 30, 2004, U.S. Appl. No. 11/027,480, pp. 1-29.

Papasouliotis et al., "Multi-Step Nanolaminate Dielectric Deposition and Etch Back Gap Fill Process", Novellus Systems, Inc., filed Dec. 30, 2004, U.S. Appl. No. 11/026,563, pp. 1-28.

Rulkens et al., "Chamber and Chamber Surface Materials to Inhibit Deposition and Methods of Making Same", Novellus Systems, Inc., filed Dec. 23, 2004, U.S. Appl. No. 11/027,388, pp. 1-26.

Papasouliotis et al., "Methods for Forming High Density, Conformal, Silica Nanolaminate Films Via Pulsed Deposition Layer In Structures of Confined Geometry", Novellus Systems, Inc., filed Dec. 30, 2004, U.S. Appl. No. 11/026,284, pp. 1-24.

U.S. Office Action mailed Oct. 6, 2005, from U.S. Appl. No. 10/975,028.

Tarafdar et al., "Sequential Deposition/Anneal Film Densification Method", Novellus Systems, Inc., filed Oct. 26, 2004, U.S. Appl. No. 10/975,028, pp. 1-34.

Papasouliotis, George D., "Optimal Operation of Conformal Silica Deposition Reactors", Novellus Systems, Inc., U.S. Appl. No. 11/077,198, filed Mar. 9, 2005, pp. 1-32.

Papasouliotis, George D., "Optimal Operation of Conformal Silica Deposition Reactors", Novellus Systems, Inc., U.S. Appl. No. 11/077,108, filed Mar. 9, 2005, pp. 1-31.

Cho et al., "Hydroxyl Bond Removal and Film Densification Method for Oxide Films Using Microwave Post Treatment", Novellus Systems, Inc., U.S. Appln. No. Not yet assigned, filed Nov. 15, 2005, pp. 1-27.

U.S. Office Action mailed Nov. 10, 2005, from U.S. Appl. No. 11/021,558.

* cited by examiner

MIXED ALKOXY PRECURSORS AND METHODS OF THEIR USE FOR RAPID VAPOR DEPOSITION OF SIO₂ FILMS

BACKGROUND OF THE INVENTION

It is often necessary in semiconductor processing to fill a high aspect ratio gap with insulating material. As device dimensions shrink and thermal budgets are reduced, void-free filling of high aspect ratio spaces (AR>3.0:1) becomes increasingly difficult due to limitations of existing deposition processes. The deposition of doped or undoped silicon dioxide assisted by high density plasma CVD, a directional (bottom-up) CVD process, is the method currently used for high aspect ratio (AR) gap-fill. Evolving semiconductor device designs and dramatically reduced feature sizes have resulted in several applications where High Density Plasma (HDP) processes are challenged in filling the high aspect ratio structures (AR>7:1) using existing technology (see, for example, U.S. Pat. No. 6,030,881, which is hereby incorporated by reference herein for all purposes). For structures representative of 65 nm and 45 nm technology nodes, engineering the gap-fill process becomes structure dependent, hence the process needs to be reoptimized, a task of considerable complexity, every time a new structure needs to be filled.

Chemical vapor deposition (CVD) has traditionally been the method of choice for depositing conformal silicon dioxide films. However, as design rules continue to shrink, the aspect ratios (depth to width) of features increase, and traditional CVD techniques can no longer provide adequately conformal films in these high aspect ratio features.

An alternative to CVD is atomic layer deposition (ALD). ALD methods involve self-limiting adsorption of reactant gases and can provide thin, conformal dielectric films within high aspect ratio features. Atomic Layer Deposition (ALD) is a method with which extremely conformal films can be deposited. ALD methods have been developed for the deposition of SiO₂ film. Because the ALD approach deposits only one atomic layer per cycle, it is extremely slow. Recently a method has emerged for self-limiting conformal film growth of multiple SiO₂ layers per deposition cycle. See, Hausmann, D.; Becker, J.; Wang, S.; Gordon, R. G. Science 2002, 298, 402 and Miller, K. A.; John, C.; Zhang, K. Z.; Nicholson, K. T.; McFeely, F. R.; Banaszak Holl, M. M. Thin Solid Films 2001, 397, 78.

An ALD-based dielectric deposition technique typically involves adsorbing a metal containing precursor onto the substrate surface, then, in a second procedure, introducing a silicon oxide precursor gas. The silicon oxide precursor gas reacts with the adsorbed metal precursor to form a thin film of metal-doped silicon oxide. One drawback, however, to ALD is that the deposition rates are very low. Films produced by ALD are also very thin (i.e., about one monolayer); therefore, numerous ALD cycles must be repeated to adequately fill a gap feature. These processes are unacceptably slow in many manufacturing environment applications.

A related technique, referred to as rapid vapor deposition (RVD) processing, is another alternative. RVD is similar to ALD in that reactant gases are introduced alternately over the substrate surface, but in RVD the silicon oxide film can grow more thickly. Thus, RVD methods allow for rapid film growth similar to using CVD methods but with the film conformality of ALD methods.

It is desirable to improve the performance of RVD techniques, leading to improved film growth rate, greater self-limiting film thickness, reduced aluminum (or other catalyst) content, and decreased film moisture and OH content. Additionally, it is desirable to use precursors with lower melting points and higher volatility.

SUMMARY OF THE INVENTION

The present invention provides a method for using mixed alkoxy substituted silicon precursors to achieve a faster maximum growth rate due to a higher self-limiting coating film thickness of SiO₂ containing films using rapid vapor deposition (RVD). It pertains to dielectric gap fill applications.

This method involves two principle operations: 1) exposing a substrate surface to a catalytic metal-based precursor, for example an aluminum-containing precursor gas to substantially saturate the surface with aluminum, and 2) exposing the substrate surface to a mixed alkoxy silicon-containing precursor gas to form a dielectric layer on the substrate surface. As noted above, the metal-based precursor on the substrate surface acts as an activation layer (or, in subsequent cycles, a re-activation layer) catalyzing a reaction with the subsequently deposited silicon precursor to form a dielectric more than one monolayer thick. These operations may be repeated as necessary to form a dielectric layer of the desired thickness.

Various process precursors may be used in preferred embodiments of the invention. For example, the catalytic metal-containing precursor can be hexakis(dimethylamino) di-aluminum or tri-methyl aluminum. Alternatively, the metal-containing precursor can be a zirconium, hafnium, gallium, titanium, niobium, or tantalum compound, which is used to form a metal monolayer or the corresponding metal oxide or nitride. To obtain monolayer coverage of the metal containing catalyst, exposure of the substrate to the metal precursor gas does not need to be very finely controlled. Flow rates of metal-containing precursor gas can range broadly, e.g., between about 1 and 10000 sccm. Alternatively flow rates are not controlled and the substrate is exposed to sufficient metal precursor that a monolayer coverage will form. Preferred flow rates of aluminum-containing precursor gas range between about 1 and 400 sccm. Alternately, the metal-containing precursor may be introduced into an isolated reaction chamber by opening a valve to a second chamber that contains a fixed amount of that precursor (i.e., 0.0001 to 1 g.)

The silicon-containing precursor is a silicon organic compound that contains at least two different alkoxy/aryloxy substituents, where R is an alkyl or aryl group. The precursor preferably contains one OH substituent on silicon. Optionally the silicon compound contains —H substituents (hydride) or alkyl or aryl substituents. The silicon precursor is broadly defined by formula (I):

$$R^A R^B R^C R^D Si \qquad (I)$$

wherein $R^A$, $R^B$, $R^C$ and $R^D$ are chosen from the group of H, OH, methyl, ethyl, propyl, butyl, phenyl, methoxy, ethoxy, propoxy, iso-propoxy, butoxy, sec-butoxy, tert-butoxy, pentoxy, iso-pentoxy, tert-pentoxy, neopentoxy ($C_5H_{11}O$), phenoxy; and wherein up to two of $R^A$, $R^B$, $R^C$ and $R^D$ are OH groups; and wherein at least two of $R^A$, $R^B$, $R^C$ and $R^D$ are alkoxy or aryloxy groups that are not identical.

In a more specific embodiment, the precursor is defined by formula II:

$$(RO)_x(R'O)_ySi(OH)_z \quad (II)$$

wherein $x+y+z=4$, $x+y \geq 2$, R and R' are selected from the group consisting of secondary and tertiary lower alkyl groups such as iso-propyl, sec-butyl, tert-butyl, sec-pentyl or tert-pentyl groups and R≠R'. For example, a tert-butoxy group, —C(CH$_3$)$_3$ or tBuO, may be chosen for R and an iso-propyl group, —CH(CH$_3$)$_2$ or iPrO may be chosen for R', such that $x=1$, $y=2$ and $z=1$, resulting in the compound: $(iPrO)_2(tBuO)SiOH$.

Many other combinations of substituents defined by these formulas can be used.

In preferred embodiments of the invention, the substrate is a partially fabricated semiconductor wafer. Further, the wafer may include shallow trench isolation (STI) features, over which the dielectric film is to be deposited.

Exposure to the catalytic metal (e.g., aluminum)-containing precursor and the silicon-containing precursor may occur in different chambers in preferred embodiments of the invention. Further, additional precursor gases may be used.

DETAILED DESCRIPTION

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances well-known processes, procedures and components have not been described in detail so as not to unnecessarily obscure aspects of the present invention.

As indicated, the present invention provides a method for using mixed alkoxy precursors to achieve a faster maximum growth rate due to a higher self-limiting coating film thickness of SiO$_2$ films using rapid vapor deposition (RVD), and dielectric films having a mixed alkoxy substituent composition. It pertains to dielectric gap fill applications.

This method involves two principle operations: 1) exposing a substrate surface to a catalytic metal-based precursor, for example an aluminum-containing precursor gas to a substantially saturated surface of aluminum-containing precursor, and 2) exposing the substrate surface to a mixed alkoxy silicon-containing precursor gas to form a dielectric layer on the substrate surface. As noted above, the metal based precursor on the substrate surface acts as an activation layer (or, in subsequent cycles, a re-activation layer) catalyzing a reaction with the subsequently deposited silicon-containing precursor to form a dielectric more than one monolayer thick. These operations may be repeated as necessary to form a dielectric layer of the desired thickness.

Generally, a RVD method involves sequentially depositing a plurality of atomic-scale films on a substrate surface by sequentially exposing and removing reactants to and from the substrate surface. An exemplary case of RVD using reactant gases A and B will now be used to illustrate principle operations of a RVD process in accordance with the present invention. First, gas A is injected into a chamber and the molecules of gas A are chemically or physically adsorbed to the surface of a substrate, thereby forming a "saturated layer" of A. Formation of a saturated layer is self-limiting in nature and represents a thermodynamically distinct state of adsorbed A on a surface. In some cases, a saturated layer is only one monolayer. In other cases, a saturated layer is a fraction of a monolayer, or some multiple monolayers. After a saturated layer of A is formed, an inert gas is preferably used to purge the substrate surface and reaction chamber (not shown). It should be noted that a purge gas can be used in between operations wherein contact between reactant gases should be avoided, including between each RVD operation. Further, the purge gas can be flowed continuously during any of these operations and a period or periods between the operations. Purge gases are generally inert, that is, are not reactive toward the substrate, process gasses, or reactor surfaces at the pressure and temperature of operation. Examples include argon (or other noble gases He, Ne, Kr, Xe) and nitrogen. The reaction chamber may additionally be evacuated following inert gas purge.

Thereafter, the gas B is injected so that it comes in contact with the adsorbed layer of A and reacts to form a reaction product of A and B. Because the saturated layer of A is nominally thin and evenly distributed over the substrate surface, excellent film step coverage can be obtained. B is flowed over the substrate for a period of time sufficient to allow the reaction between A and B to preferably go to completion; i.e., all of the adsorbed A is consumed in the reaction. In a RVD process, B is flowed over the substrate for a period of time sufficient for B to accumulate to thicknesses in excess of one monolayer. When the film growth rate decreases, the film reaches a limiting thickness for the cycle and the flow of B is stopped. At this point, residual gas B and any byproducts of the reaction are purged from the chamber. Further RVD cycles of substrate exposure to A, re-activating the catalytic properties of the surface, followed by exposure to B, can be implemented and repeated as needed for multiple layers of material to be deposited.

RVD methods are related to the well-established chemical vapor deposition (CVD) techniques. However, in CVD, the chemical reactant gases are simultaneously introduced in a reaction chamber and allowed to mix and chemically react with each other in gas phase. The products of the mixed gases are then deposited on the substrate surface. Thus, RVD methods differ from CVD since in RVD the chemical reactant gases are individually injected into a reaction chamber and not allowed to mix prior to contacting the substrate surface. That is, RVD is based on separated surface-controlled reactions.

While the invention is not limited to this theory of operation, it is believed that the accumulation of dielectric film is achieved via a polymerization and cross-linking mechanism. In this mechanism, the saturated layer of aluminum, for example, precursor can catalytically polymerize a silicon-containing precursor(s) to produce growing chains of silica. After a period of growth determined by the substrate temperature and the composition of the silicon-containing precursor(s), the silica polymer can "gel" or "cross-link" to form a solid silicon dioxide. The film can be made thicker by repeating the number of precursor deposition cycles.

Figure 1:
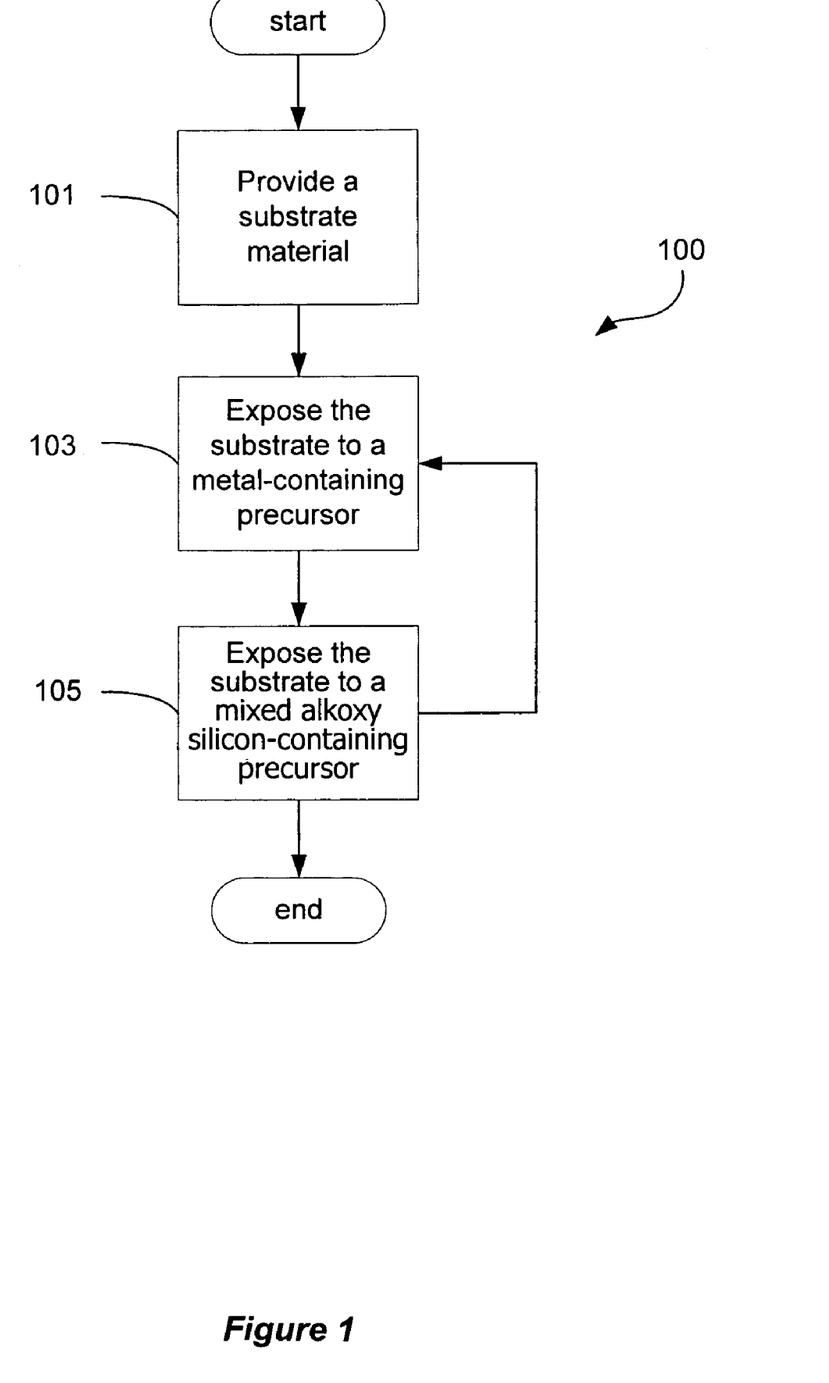
FIG. 1 is a process flow diagram illustrating relevant operations employing rapid vapor deposition (RVD) with a mixed alkoxy silicon-containing precursor to form a low-k dielectric with desirable performance in accordance with the present invention.
Figure 2:
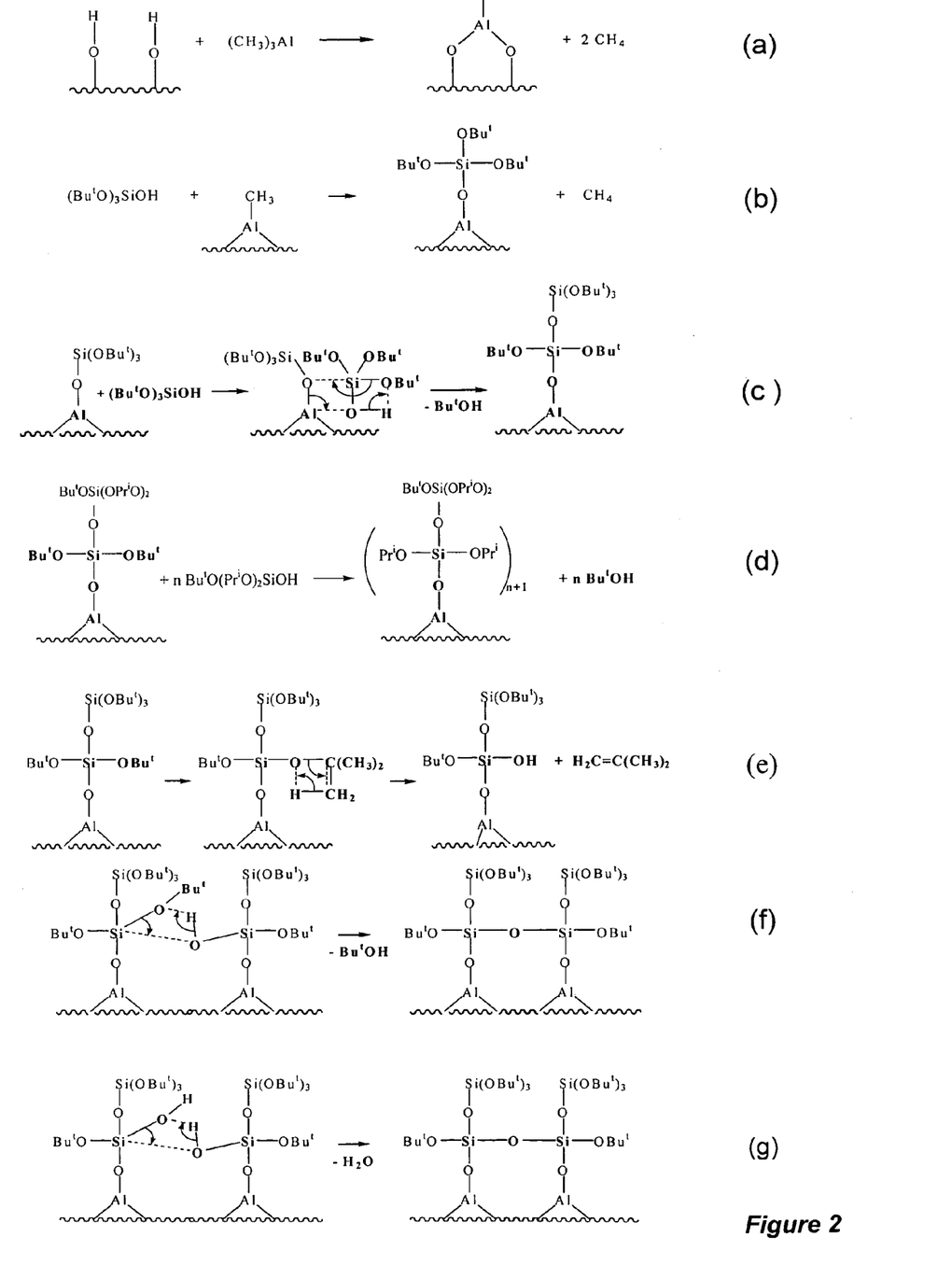
FIG. 2 is a drawing of a hypothesized reaction scheme for a rapid vapor deposition (RVD) with a mixed alkoxy silicon-containing precursor, to form a dielectric with desirable performance, in accordance with one embodiment of the present invention.

FIG. 1 is a process flow diagram illustrating relevant operations in a rapid vapor deposition (RVD) process to form a dielectric in accordance with the present invention. The proposed mechanism for the RVD process is shown in FIG. 2, where chemical reaction stages (a)–(g) are detailed for a specific embodiment of the invention.

The deposition process 100 begins with operation 101, wherein a substrate is placed into a deposition chamber. For many embodiments of the invention, the substrate is a semiconductor wafer. A "semiconductor wafer" as discussed in this document is a semiconductor substrate at any of the various states of manufacture/fabrication in the production of integrated circuits.

Next, in operations 103–105, an RVD process is used to deposit a dielectric layer on the substrate. For an example of a suitable RVD process, see U.S. patent application Ser. No. 10/672,309, titled "Properties Of A Silica Thin Film Produced By A Rapid Vapor Deposition [RVD] Process", filed on Sep. 26, 2003, which is hereby incorporated by reference herein for all purposes. In operation 103, illustrated in reaction stage (a) above, a metal catalyst-containing precursor gas is pumped into the deposition chamber so as to substantially saturate the surface with the metal-catalyst containing precursor.

Any suitable metal catalyst-containing precursor that can sufficiently adsorb onto the substrate surface and sufficiently react with the subsequently added silicon-containing precursor to form a dielectric layer that is more than a monolayer thick may be used. In addition, the metal-containing precursor should be capable of aiding the catalytic polymerization of the subsequently added silicon-containing precursor to produce a film thicker than a monolayer. In preferred embodiments, an aluminum-containing precursor, for example, hexakis(dimethylamino)di-aluminum $(Al_2(N(CH_3)_2)_6)$ or trimethyl aluminum $(Al(CH_3)_3)$ is used. Other suitable aluminum-containing precursors include, for example, triethyl aluminum $(Al(CH_2CH_3)_3)$ or aluminum tri-chloride $(AlCl_3)$. Other metal-containing precursors that can be deposited to reactivate the catalytic surface include, but are not limited to, zirconium, hafnium, gallium, titanium, niobium, tantalum, and their halogenides, oxides or nitrides. Referring to FIG. 2, operation 103 is visualized in equation (a), where tri-methyl-aluminum is used as the metal catalyst-containing precursor.

Next, after the chamber is purged, process 100 continues with the exposure of the substrate to a mixed-alkoxy silicon-containing precursor gas under conditions suitable for the growth of a dielectric film in operation 105, corresponding to reaction stages (b)–(g) above.

The silicon-containing precursor is an organosilane or organosilanol/diol with more then one kind of alkoxide substituent broadly defined by formula (I):

$$R^A R^B R^C R^D Si \qquad (I)$$

wherein $R^A$, $R^B$, $R^C$ and $R^D$ are chosen from the group of H, OH, methyl, ethyl, phenyl, propyl, butyl, methoxy, ethoxy, propoxy, iso-propoxy, butoxy, sec-butoxy, tert-butoxy, pentoxy, iso-pentoxy, tert-pentoxy, neopentoxy ($C_5H_{11}O$), phenoxy; and wherein up to two of $R^A$, $R^B$, $R^C$ and $R^D$ are OH groups; and wherein at least two of $R^A$, $R^B$, $R^C$ and $R^D$ are at least two different alkoxy groups. Precursor substituents R are chosen such that the reaction stages (b)–(d) (initial linear polymerization reactions) are accelerated relative to the reaction stages (e)–(g) (cross-linking reactions) in FIG. 2. This results in faster maximum linear growth rate, lower cross linking rate and a higher self-limiting coating film thickness limit.

Figure 3:
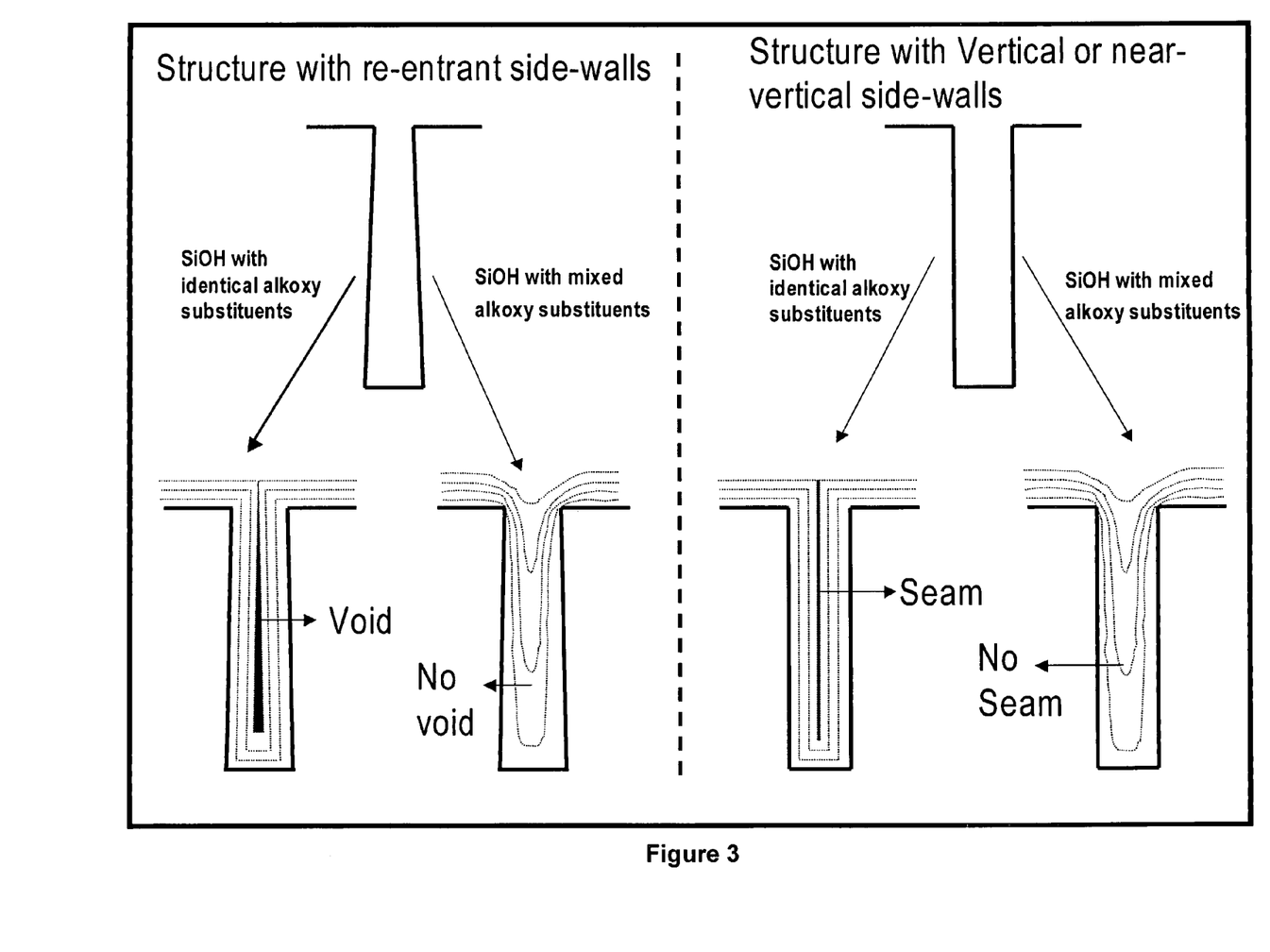
FIG. 3 is an illustration comparing the conformality of films deposited over features (having re-entrant or vertical side-walls) on a substrate using silanols with identical alkoxy substituents and silanols with mixed alkoxy substituents.

FIG. 3 is an illustration comparing the conformality of films deposited over features (having re-entrant or vertical side-walls) on a substrate using silanols with identical alkoxy substituents and silanols with mixed alkoxy substituents. A significant improvement in gap fill material is shown when using SiOH with mixed alkoxy substituents (i.e., minimization or elimination of voids or seams). It is believed that the improvement is caused by a flow-like gap fill mechanism resulting from the varying reactivity of the non-identical R groups. For instance, in one example, when the R groups are OH, tBuO and iPrO, the increased reactivity of the OH and tBuO groups in comparison with the iPrO group leads to a polysiloxane intermediate, which is essentially silicone liquid, which flows into the gaps due to capillary forces.

In a specific embodiment, the precursor is defined by formula II:

$$(RO)_x(R'O)_y Si(OH)_z \qquad (II)$$

wherein $x+y+z=4$, $x+y \geq 2$, R and R' are selected from the group consisting of secondary and tertiary lower alkyl groups and $R \neq R'$. For example, a tert-butoxy group may be chosen for R and an iso-propyl group may be chosen for R', such that $x=1$, $y=2$ and $z=1$, resulting in the compound: $(iPrO)_2(tBO)SiOH$. This example of a silanol compound according to the present invention with a mixture of secondary and tertiary carbon atoms connected to the oxygen in the above structure allows further improvement of deposition rate and improvement of desirable film properties such as film density, metal content and water content. Reactivity of the tBuOSi functionality (FIG. 2, stage (d)) is higher than the iPrOSi functionality in forming the alkene and silanol (FIG. 2, stage (e)). Thus the rate of polymerization is much higher compared to the rate of cross linking, resulting in faster film growth, higher film thickness per cycle and fewer cycles required to achieve conformal gap fill. Other examples include $(secBuO)_2 tBuOSiOH$, $(EtO)_2(iPrO)SiOH$, $(tBuO)(iPrO)_2 SiH$, $(MeO)_2 Si(OiPr)_2$ Of course, many other combinations of substituents forming precursor compounds defined by these formulas other than those specifically noted herein can be used. In general choosing different substituents for R and R' allows tuning of the film deposition properties. The mixed-alkoxy silicon-containing precursor can be used alone or as mixture together with any other type of silicon organic precursor As indicated earlier, forming a saturated layer is a self-limiting process and to a certain extent independent of process conditions. Relevant process conditions can include pressure, precursor flow rate, substrate temperature, exposure times and dose. Process parameters during exposure to the silicon-containing precursor will vary depending on the types of precursors used, reaction chamber configuration and desired final film thickness, deposition rate and dielectric characteristics, among other variables. Temperatures range broadly, from between about 0° C. and 800° C., preferably between 100° C. and 600° C., and most optimally between 200° C. and 450° C. Pressures can range broadly, e.g., between about 1 mTorr and 760 Torr. Typical pressures range between about 0.1 Torr and 750 Torr. Flow rates of silicon-containing precursor gas can range broadly, e.g., between about 1 and 10000 sccm. Preferred flow rates of silicon-containing precursor gas range between about 10 and 1000 sccm. The dose of silicon-containing precursor can range broadly, e.g., between about 0.001 milligrams and 100 grams. Typical silicon-containing precursor doses range between about 0.01 and 0.3 grams. Exposure times can range broadly, e.g., between about 1 milliseconds and 100 seconds. Preferred exposure times typically range between about 1 and 10 seconds. The number of separate exposures to silicon-containing precursor will primarily depend upon the desired final film thickness.

Silanol precursors in which at least two alkoxy substituents differ from one another, have lower symmetry, which lowers their melting enthalpy. This results in a lower melting temperature, making this type of precursors more suitable for purification through distillation and delivery to the reactor chamber. HOSi(OiPr)$_2$(OtBu) has a molecular weight of 236 g/mole, which makes its gas phase 23% lighter than HOSi(OC$_5$H$_{11}$)$_3$. This results in a vapor pressure that is roughly 10 times higher than that of (tPenO)$_3$SiOH (for the synthesis and properties of (iPrO)$_2$(Me$_3$SiO)SiOH and other mixed substituted silicon compound containing the Me$_3$SiO substituent see e.g., Holdt, Z. Chem. 1983, V23, P252.) Due to the non-symmetry, this precursor is a liquid at low temperatures. An additional benefit of lower molecular weight precursors is relatively higher SiO$_2$ content. Thus 1 g of HOSi(OiPr)$_2$(OtBu) with 25.4% SiO$_2$ is 30% more efficient in its use than 1 g of HOSi(OC$_5$H$_{11}$)$_3$ with 19.4% SiO$_2$.

For easy delivery and purification via distillation, it is desirable to use liquid silanol precursors. It is also desirable that the silanol precursor have a relatively high vapor pressure. In general, for similar compounds, the compounds with lower molecular weights have higher vapor pressures. A problem with the lower molecular weight precursors of type HOSi(OR)$_3$, however, is that some of the more suitable ones, such as (tBuO)$_3$SiOH and (tBuO)$_2$Si(OH)$_2$ are solids at room temperature. One approach to obtain suitable liquid precursors involves increasing the number of carbon atoms in the SiOH precursor. For example, the liquid precursor HOSi(OC$_5$H$_{11}$)$_3$, which has a molecular weight of 306 g/mole, is a liquid at room temperature. Unfortunately, this precursor's high molecular weight also lowers its vapor pressure, making it necessary to heat the precursor considerably to attain sufficient vapor pressure. However, heating for prolonged time will result in thermal decomposition of this precursor. The lower molecular weight silanol precursors HOSi(OC$_4$H$_9$)$_3$ (Mw=264 g/mole), HOSi(OC$_3$H$_7$)$_3$ (Mw=222 g/mole) and (HO)$_2$Si(OC$_4$H$_9$)$_2$ (Mw=208 g/mole) all are much more volatile, but they also are all solids, which makes their purification and delivery inconvenient. At higher deposition temperatures, e.g., above 190° C. a dielectric film can be effectively formed from a silicon-containing precursor in which R is a tertiary or secondary carbon substituent and R' a primary, such as in HOSi(OiPr)(OEt)$_2$. Synthetic access to these mixed alkoxy silanol precursors is relatively straight forward. (see Holdt, Z., cited above.)

In preferred embodiments of the invention, the substrate is a partially fabricated semiconductor wafer. Further, the wafer may include shallow trench isolation (STI) features, over which the dielectric film is to be deposited. Other potential substrates include, quartz, sapphire, glasses, ceramics, germanium or metals.

Exposure to the catalytic metal (e.g., aluminum)-containing precursor and the silicon-containing precursor may occur in different chambers in preferred embodiments of the invention. Further, additional precursor gases may be used.

Figure 4:
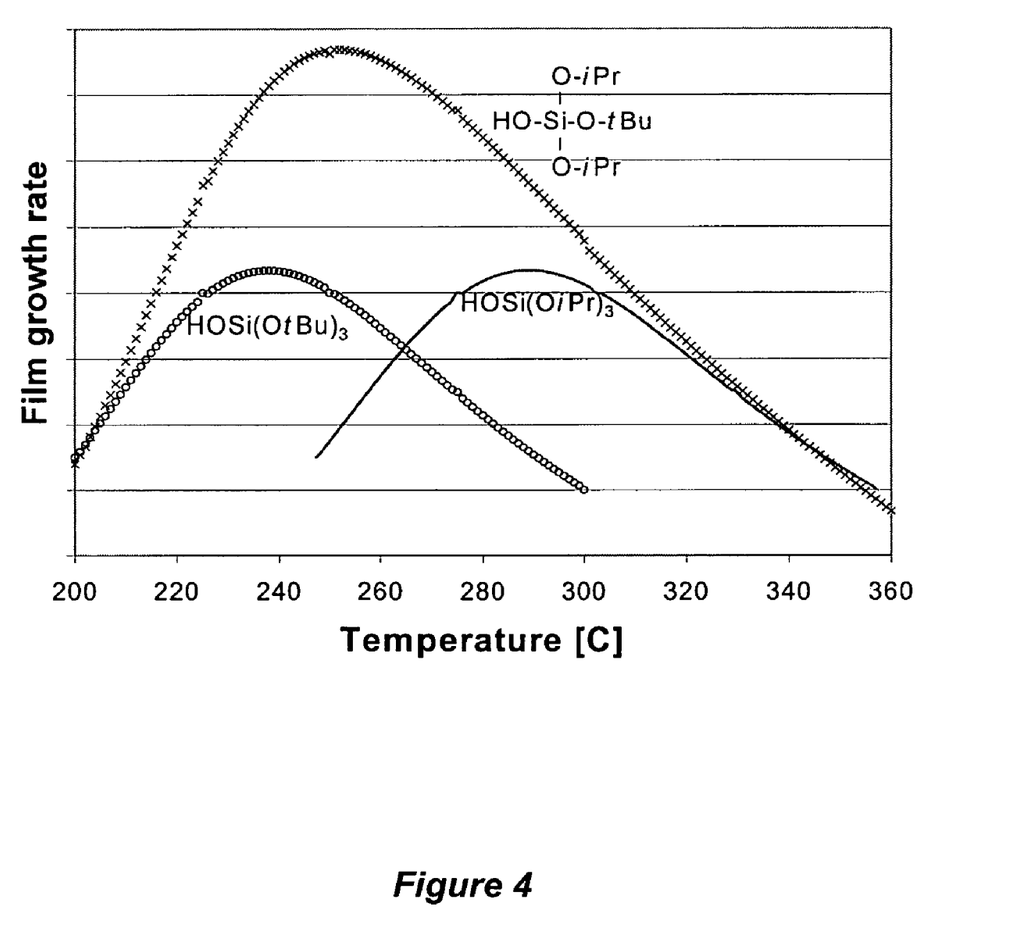
FIG. 4 is a plot of film growth rate vs. temperature with data comparing the growth rates of RVD using single alkoxy silicon-containing precursors with a mixed alkoxy silicon-containing precursor in accordance with one embodiment of the present invention.

FIG. 4 is a plot of film growth rate vs. temperature to illustrate the same or greater deposition rate at high temperature (i.e., 300° C.) as the maximum achievable with conventional single substituent (at lower temperatures (240 and 290° C.) for single substituent precursors). In the figure, the two smaller curves plot the reaction rates of HOSi(OtBu)$_3$ and HOSi(OiPr)$_3$, two precursors each with a single type of alkoxy substituent, versus temperature. Note that the curve is shifted to a higher temperature for HOSi(OiPr)$_3$ compared to HOSi(OtBu)$_3$ due to the nature of the iPrO leaving groups.

Additionally, the curve for HOSi(OiPr)$_2$(OtBu) is shown. This mixed alkoxy precursor allows for running the reaction at a higher temperature, which results in faster linear polymerization of the precursor and a relative suppression cross-linking in the film. Smaller iso-proxy groups allow more efficient diffusion of the silanol precursor to the catalytic metal (Al) center, which further enhances the film growth rates. At 250° C., a much higher deposition rate is achieved with mixed alkoxy-substituted (iPrO)$_2$(tBO)SiOH, than with conventional single alkoxy tris(tert-butoxy)silanol precursor. As an added benefit, a faster film growth rate leads to fewer cycles and thus fewer applications of metal (e.g., aluminum) catalyst, which in turn allows for less aluminum to be incorporated into the film. In general, choosing different alkoxy substituents allows for tuning of the film deposition properties.

Figure 5:
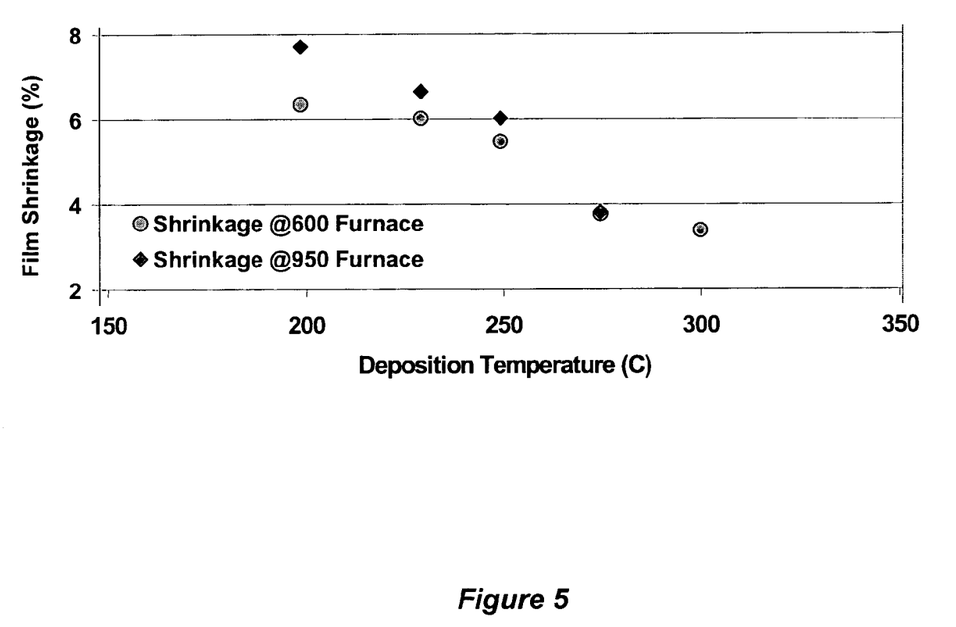
FIG. 5 is a plot of film shrinkage vs. deposition temperature illustrating the advantage of depositing a dielectric film at a higher temperature.

Figure is a 5 plot of film shrinkage vs. deposition temperature, illustrating the advantage of depositing a film at a higher temperature (e.g., 300° C.), as can be done according to this invention without sacrificing deposition rate relative to the conventional process. The figure shows that film shrinkage caused by annealing is reduced as the film deposition temperature is increased. It has also been found that the k value and the OH content decrease with increasing deposition temperature. Choosing compounds such that the optimal deposition temperature is higher than for non-mixed alkoxy silanol precursors results in improved films that require less annealing and that shrink less when annealed. This reduces the risk of stress buildup, seam formation or film de-lamination.

OTHER EMBODIMENTS

Other deposition co-reactants may be used to improve the characteristics of dielectric films formed in accordance with the present invention. Furthermore, the properties of the dielectric film maybe improved by other means as well, including by using an aluminum oxide nucleation layer formed by ALD prior to the application of the silica layer and by a post deposition high density plasma (HDP) annealing process. See, for example, U.S. patent application Ser. No. 10/875,158, titled "Silica Thin Films Produced By Rapid Surface Catalyzed Vapor Deposition (RVD) Using a Nucleation Layer", and U.S. patent application Ser. No.

10/874,696, titled "Method For Controlling Properties Of Conformal Silica Nanolaminates Formed By Pulsed Layer Deposition (PLD)", which are concurrently filed with the present application and incorporated by reference in their entirety for all purposes. Note also that this technique may be used in combination with a phosphorous getterer as described in U.S. patent application Ser. No. 10/874,808, titled "Aluminum Phosphate Incorporation In Silica Thin Films Produced By Rapid Surface Catalyzed Vapor Deposition (RVD)"concurrently filed with the present application and incorporated in its entirety for all purposes.

RVD Apparatus

Figure 6:
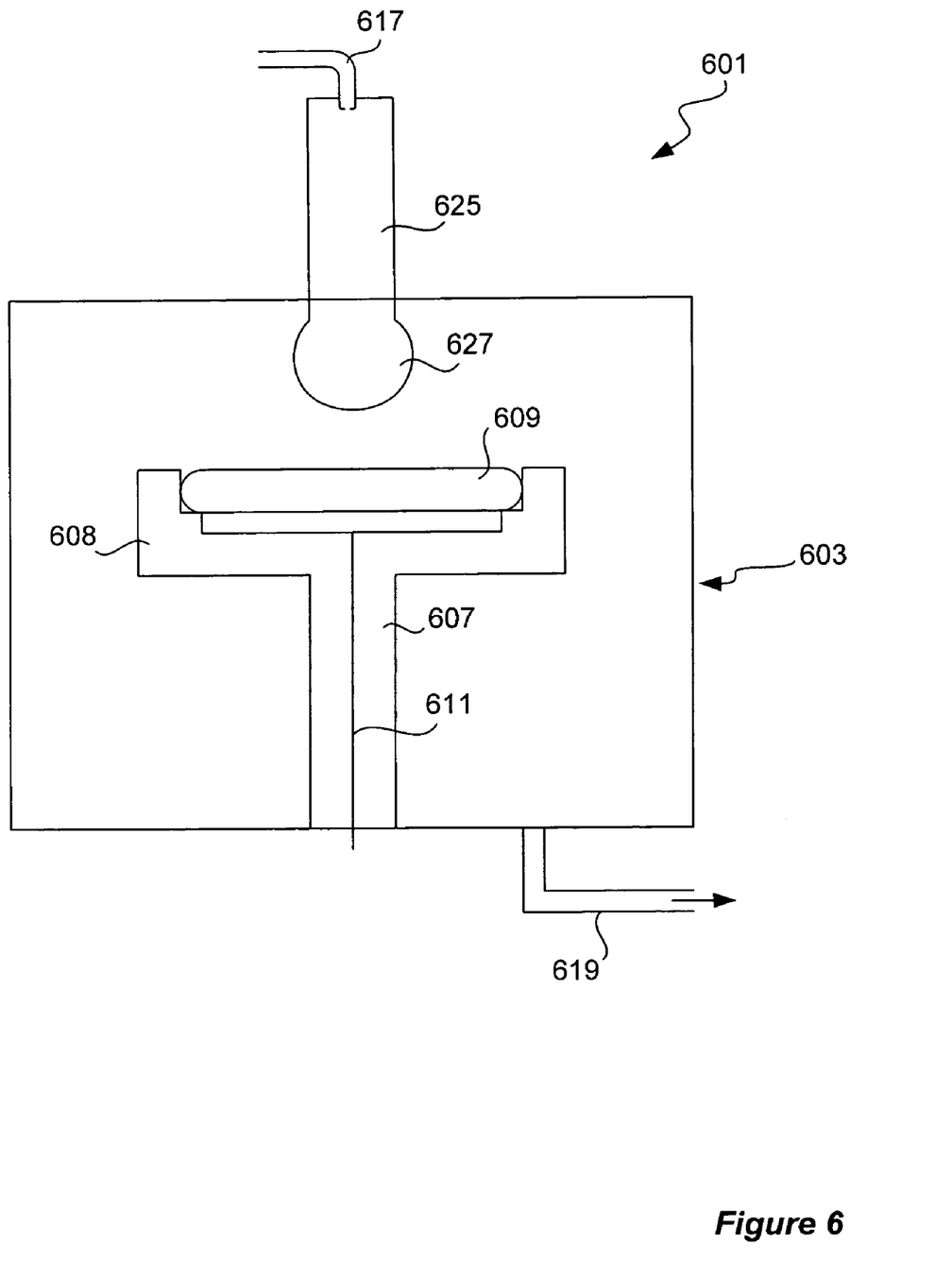
FIG. 6 is a schematic diagram showing the basic features of a RVD reactor module suitable for practicing the present invention.

FIG. 6 is a block diagram depicting some components of a suitable dual source RF/microwave plasma reactor for performing a RVD process in accordance with this invention. Note that this apparatus is only an example of suitable apparatus for RVD processes in accordance with the present invention. Many other apparatuses and systems, including a multi-chambered apparatus, may be used.

As shown, a reactor 601 includes a process chamber 603, which encloses components of the reactor and serves to contain the reactant gases and provide and area to introduce the reactant gases to substrate 609. The chamber walls may be made of or plated with any suitable material, generally a metal that is compatible with the deposition and associated processes conducted therein. In one example, the process chamber walls are made from aluminum. Within the process chamber, a wafer pedestal 607 supports a substrate 609. The pedestal 607 typically includes a chuck 608 to hold the substrate in place during the deposition reaction. The chuck 608 may be an electrostatic chuck, a mechanical chuck or various other types of chuck as are available for use in the industry and/or research. A heat transfer subsystem including lines 611 for supplying a heat transfer fluid to the pedestal 607 controls the temperature of pedestal 607. In some embodiments, the heat transfer fluid comprises water or another liquid. The reactant gases, as well as inert gases during purge, are introduced individually into the reactor at tube 625 via inlet 617. A showerhead 627 may be used to distribute the gas flow uniformly in the process reactor. Reactant gases are introduced through a gas supply inlet mechanism including orifices. There may be multiple reactant gas tubes and inlets. A vacuum pump (e.g., a turbomolecular pump) connected to outlet 619 can draw out gases between RVD cycles.

Various details of the apparatus have been omitted for clarity's sake, and various design alternatives may be implemented. For example, in an alternate embodiment (not shown), there may be multiple deposition chambers, such that different depositions may occur in different chambers.

EXAMPLES

The following example provides details concerning the implementation of an embodiment of the present invention. It should be understood the following is representative only, and that the invention is not limited by the detail set forth in this example. This example compares the effects of using HOSi(Oi-Pr)$_2$(Ot-Bu) or HOSi(Oi-Pr)$_2$(Ot-Pen) instead of HOSi(Ot-Pen)$_3$ as a silicon-containing precursor in and RVD process Referring once again to FIG. 2, the relative rates of reaction of stages (d) and (e) determine the growth rate and limit of the film thickness. A high rate for reaction stage (d) and a low rate for reaction stage (e) results in fast growth rate and higher film thickness per cycle. The rates of reaction of stages (d) and (e) are determined by mainly two factors: 1) the nature of the substituents and 2) the reaction temperature. At higher temperature, the relative increase of rate of reaction of stage (e) and subsequent stages dominates the reaction and a low film growth rate results with low film thickness per cycle. For HOSi(Ot-Pen)$_3$ the film thickness per cycle decreases from 150 Å to 40 Å from 230° C. to 300° C. due to the increased rate of cross linking.

Isopropyl groups are thermally more stable than Ot-Pen groups and thus suppress the reaction rate of stage (e). However if all substituents are isopropyl groups, the reaction rate of stage (d) is also suppressed. If, however, one substituent is -OtBu and the remaining two are -OiPr, the reaction rate of (d) is the same, but the reaction rate of (e) is suppressed, relative to HOSi(Ot-Pen)$_3$ resulting in the film growth rate vs. temperature profile shown in FIG. 3. A summary of these experimental results is shown in table 1 below.

TABLE 1

| Reagent | $T_m$ | $M_w$ [g/mol] | % SiO$_2$ | $P_v$ at 100° C. [Torr] |
|---|---|---|---|---|
| HOSi(Oi-Pr)$_2$(Ot-Bu) | <20° C. | 236 | 24.5 | 25 |
| HOSi(Ot-Pen)$_3$ | <20° C. | 306 | 19.6 | 2 |

$T_m$ = melting temperature,
$M_w$ = molecular weight,
$P_v$ = vapor pressure.

CONCLUSION

Although the foregoing invention has been described in some detail for purposes of clarity of understanding, it will be apparent that certain changes and modifications may be practiced within the scope of the appended claims. It should be noted that there are many alternative ways of implementing both the process and compositions of the present invention. For example, while the invention has been described primarily in terms of preparing integrated circuits, it is not so limited. Accordingly, the present embodiments are to be considered as illustrative and not restrictive, and the invention is not to be limited to the details given herein, but may be modified within the scope and equivalents of the appended claims.

The entire disclosures of all references cited herein are incorporated by reference for all purposes.

It is claimed:

1. A method of forming a dielectric film, the method comprising:
   (a) exposing a substrate surface to a metal-containing precursor gas to form a substantially saturated layer of catalytic metal-containing precursor on the substrate surface;
   (b) exposing the substrate surface to a mixed alkoxy-substituted silicon-containing precursor gas to form the dielectric film.

2. The method of claim 1, wherein the mixed alkoxy-substituted silicon-containing precursor has the formula:

wherein $R^A$, $R^B$, $R^C$ and $R^D$ are chosen from the group of H, OH, methyl, ethyl, phenyl, propyl, butyl, methoxy, ethoxy, propoxy, iso-propoxy, butoxy, sec-butoxy, tert-butoxy, pentoxy, iso-pentoxy, tert-pentoxy, neopentoxy (C$_5$H$_{11}$O), phenoxy;

wherein up to two of $R^A$, $R^B$, $R^C$ and $R^D$ are OH groups; and wherein at least two of $R^A$, $R^B$, $R^C$ and $R^D$ are at least two different alkoxy groups.

3. The method of claim 1, wherein the mixed alkoxy-substituted silicon-containing precursor has the formula:

$$(RO)_x(R'O)_ySi(OH)_z \quad \text{(II)}$$

wherein $x+y+z \geq 4$, $x+y \geq 2$, R and R' are selected from the group consisting of secondary and tertiary lower alkyl groups and $R \neq R'$.

4. The method of claim 1 wherein the mixed alkoxy-substituted silicon-containing precursor gas is selected from $(iPrO)_2(tBO)SiOH$ $(secBuO)_2tBuOSiOH$, $(EtO)_2(iPrO)SiOH$, $(tBuO)(iPrO)_2SiOH$ and $(MeO)_2Si(OiPr)_2$.

5. The method of claim 1, wherein the metal containing precursor is selected from the list of metal-containing precursors comprising: Aluminum, Zirconium, Hafnium, Gallium, Titanium, Niobium, and Tantalum.

6. The method of claim 1, wherein the temperature at which (b) is performed is between about 0° C. and 800° C.

7. The method of claim 1, wherein the temperature at which (b) is performed is between about 100° C. and 600° C.

8. The method of claim 1, wherein the temperature at which (b) is performed is between 200° C. and 450° C.

9. The method of claim 1, further comprising a post deposition treatment to densify the dielectric film.

10. The method of claim 1, wherein the treatment comprises thermally annealing the dielectric film.

11. The method of claim 1, wherein the substrate is a partially fabricated semiconductor wafer.

12. The method in claim 11, wherein the dielectric film is deposited over a gap in the partially fabricated semiconductor wafer.

13. The method of claim 1, wherein the aluminum-containing precursor is at least one of hexakis(dimethylaminno) di-aluminum and tri-methyl aluminum.

14. The method of claim 1, wherein the silicon-containing precursor is at least one of a silanol and a silanediol.

15. The method of claim 1, wherein the silicon-containing precursor is $HOSi(Oi-Pr)_2(OR)$, where R=tBu or tPen.

16. The method of claim 1, wherein the flow rate of aluminum-containing precursor gas range between about 1 and 400 sccm.

17. The method of claim 1, wherein the flow rate of silicon-containing precursor gas range between about 10 and 1000 sccm.

18. The method of claim 1, further comprising purging with an inert gas between exposures of precursor gas.

19. The method of claim 5, wherein the metal-containing precursor comprises aluminum.

* * * * *

UNITED STATES PATENT AND TRADEMARK OFFICE
CERTIFICATE OF CORRECTION

PATENT NO. : 7,097,878 B1 Page 1 of 1
APPLICATION NO. : 10/874814
DATED : August 29, 2006
INVENTOR(S) : Rulkens et al.

It is certified that error appears in the above-identified patent and that said Letters Patent is hereby corrected as shown below:

In the Cover Page:

On page 1 of the Cover Page, in the section titled "Other Publications" add: --Dennis Michael Hausmann, "Atomic Layer Deposition of Metal Oxide Thin Films," A thesis presented by Harvard University, 186 pages, July 2002.--

On page 1 of the Cover Page, in the section titled "Other Publications" add: --Hausmann, et al., "Rapid Vapor Deposition of Highly Conformal Silica Nanolaminates," Science, Vol. 308, October 2002, 5 pages.

On page 1 of the Cover Page, in the section titled "Other Publications" add: --Gordon, et al., "A Kinetic Model for Step Coverage by Atomic Layer Deposition in Narrow Holes or Trenches," Chemical Vapor Deposition 2003, 9, No. 2, 99. 73-78.--

On page 1 of the Cover Page, in the section titled "Other Publications" add: --Gaillard, et al., "Effect of Plasma and Thermal Annealing on Chemical Vapor Deposition Dielectrics Grown Using $SIH_4$-$H_2O_2$ gas mixtures," J. Vac. Sci. Technol. A 15(5), Sep/Oct 1997, pages 2478-2484.--

Signed and Sealed this

Seventh Day of August, 2007

JON W. DUDAS
*Director of the United States Patent and Trademark Office*